United States Patent
Matsubara et al.

(10) Patent No.: US 12,105,156 B2
(45) Date of Patent: Oct. 1, 2024

(54) SHORT CIRCUIT DETERMINATION APPARATUS, SWITCH APPARATUS, AND SHORT CIRCUIT DETERMINATION METHOD

(71) Applicant: FUJI ELECTRIC CO., LTD., Kanagawa (JP)

(72) Inventors: Kunio Matsubara, Hino (JP); Ryoga Kiguchi, Tachikawa (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 229 days.

(21) Appl. No.: 17/679,020

(22) Filed: Feb. 23, 2022

(65) Prior Publication Data
US 2022/0179011 A1  Jun. 9, 2022

Related U.S. Application Data

(63) Continuation of application No. PCT/JP2021/010428, filed on Mar. 15, 2021.

(30) Foreign Application Priority Data

Mar. 18, 2020 (JP) .................................. 2020-047251

(51) Int. Cl.
 *G01R 31/52* (2020.01)
 *G01R 15/18* (2006.01)
 (Continued)

(52) U.S. Cl.
CPC ........... *G01R 31/52* (2020.01); *G01R 15/181* (2013.01); *G01R 19/16566* (2013.01); *G01R 31/327* (2013.01); *H03K 17/687* (2013.01)

(58) Field of Classification Search
CPC ............... G01R 31/52; G01R 15/181; G01R 19/16566; G01R 31/327; H03K 17/687
See application file for complete search history.

(56) References Cited

U.S. PATENT DOCUMENTS

| 10,778,001 B2 | 9/2020 | Uchida |
| 2006/0164772 A1* | 7/2006 | Guo ........................ H02H 3/445 |
| | | 361/93.1 |

(Continued)

FOREIGN PATENT DOCUMENTS

| JP | 2001169533 A | 6/2001 |
| JP | 3409620 B2 | 5/2003 |

(Continued)

OTHER PUBLICATIONS

Langmaak Niklas_WO 2016008594 A1_machine translation (Year: 2016).*

(Continued)

*Primary Examiner* — Eman A Alkafawi
*Assistant Examiner* — Suresh K Rajaputra

(57) ABSTRACT

There is provided a short circuit determination apparatus including: a sensor configured to detect, in a switching device that has a control terminal, a first main terminal, and a second main terminal, a temporal change of a main current flowing between the first main terminal and the second main terminal; and a short circuit determination unit configured to determine that the switching device is short-circuited, in a case where the temporal change of the main current is larger than or equal to a first threshold value, after a first timing after a control signal for driving the control terminal is turned on.

20 Claims, 4 Drawing Sheets

(51) Int. Cl.
*G01R 19/165* (2006.01)
*G01R 31/327* (2006.01)
*H03K 17/687* (2006.01)

(56) References Cited

U.S. PATENT DOCUMENTS

| | | | | |
|---|---|---|---|---|
| 2016/0301200 | A1* | 10/2016 | Niehoff | H02H 3/021 |
| 2019/0113576 | A1* | 4/2019 | Saito | G01R 31/42 |
| 2020/0067303 | A1* | 2/2020 | Uchida | H02H 7/1203 |
| 2021/0028702 | A1 | 1/2021 | Morokuma | |

FOREIGN PATENT DOCUMENTS

| | | | |
|---|---|---|---|
| JP | 2008301617 A | 12/2008 | |
| JP | 2013231601 A | 11/2013 | |
| JP | 2015139271 A | 7/2015 | |
| WO | 2013094241 A1 | 6/2013 | |
| WO | WO-2016008594 A1 * | 1/2016 | ......... G01R 19/0092 |
| WO | 2018193527 A1 | 10/2018 | |
| WO | 2019225121 A1 | 11/2019 | |

OTHER PUBLICATIONS

International Search Report and (ISA/237) Written Opinion of the International Search Authority for International Patent Application No. PCT/JP2021/010428, issued/mailed by the Japan Patent Office on May 18, 2021.

Office Action issued for counterpart Japanese Application No. 2020-047251, issued by the Japan Patent Office on Jun. 23, 2020 (drafted on Jun. 18, 2020).

Office Action issued for counterpart Japanese Application No. 2020-047251,issued by the Japan Patent Office on Sep. 8, 2020 (drafted on Sep. 1, 2020).

* cited by examiner

SHORT CIRCUIT DETERMINATION APPARATUS, SWITCH APPARATUS, AND SHORT CIRCUIT DETERMINATION METHOD

The contents of the following Japanese patent application(s) are incorporated herein by reference:
NO. 2020-047251 filed in JP on Mar. 18, 2020
NO. PCT/JP2021/010428 filed in WO on Mar. 15, 2021

BACKGROUND

1. Technical Field

The present invention relates to a short circuit determination apparatus, a switch apparatus, and a short circuit determination method.

2. Related Art

In the related art, a power conversion apparatus that detects a short circuit of a switching device by using a Rogowski coil is known. (For example, refer to Patent Document 1).

CITATION LIST

Patent Document

[Patent Document 1] Japanese Patent Application Publication No. 2001-169533

TECHNICAL PROBLEM

In a power conversion apparatus of Patent Document 1, a voltage between terminals of a Rogowski coil is integrated, and when a value of an integrated output is detected to be higher than or equal to a certain level, a switching device is determined to be short-circuited. However, it is desired to determine that the switching device is short-circuited, as soon as possible.

GENERAL DISCLOSURE

In order to solve the above problem, a first aspect of the present invention provides a short circuit determination apparatus. The short circuit determination apparatus may include a sensor configured to detect, in a switching device that has a control terminal, a first main terminal, and a second main terminal, a temporal change of a main current flowing between the first main terminal and the second main terminal. The short circuit determination apparatus may include a short circuit determination unit configured to determine that the switching device is short-circuited, in a case where the temporal change of the main current is larger than or equal to a first threshold value, after a first timing after a control signal for driving the control terminal is turned on.

The short circuit determination unit may have a timing detection unit configured to detect the first timing, and a first determination unit configured to start to determine whether the temporal change of the main current is larger than or equal to the first threshold value, when the timing detection unit detects the first timing.

The timing detection unit may detect, as the first timing, a timing at which the temporal change of the main current is smaller than or equal to a second threshold value.

The timing detection unit may detect, as the first timing, a timing at which a predetermined period expires after the control signal is turned on.

The short circuit determination unit may further have a timing change unit configured to change a length of the predetermined period based on at least any of magnitude of the main current, a temperature of the switching device, and characteristics of the switching device.

The short circuit determination unit may further include an integrator configured to integrate the temporal change of the main current, and a second determination unit configured to determine a short circuit of the switching device based on an output of the integrator.

The short circuit determination apparatus may further include a short circuit current interruption unit configured to interrupt a short circuit current when the switching device is determined to be short-circuited.

The sensor may be a Rogowski coil.

The switching device may be a wide bandgap semiconductor device.

The wide bandgap semiconductor device may include at least any of silicon carbide, gallium nitride, gallium oxide, and diamond.

A second aspect of the present invention provides a switch apparatus. The switch apparatus may include the short circuit determination apparatus. The switch apparatus may include the switching device.

A third aspect of the present invention provides a short circuit determination method. The short circuit determination method may determine a short circuit of a switching device that has a control terminal, a first main terminal, and a second main terminal. The short circuit determination method may include detecting a temporal change of a main current flowing between the first main terminal and the second main terminal. The short circuit determination method may include determining that the switching device is short-circuited, in a case where the temporal change of the main current is larger than or equal to a first threshold value, after a first timing after a control signal for driving the control terminal is turned on.

The summary clause does not necessarily describe all necessary features of the embodiments of the present invention. The present invention may also be a sub-combination of the features described above.

BRIEF DESCRIPTION OF THE DRAWINGS

FIG. 2 shows an example of various signal waveforms in a case where a short circuit occurs during turn ON.

DESCRIPTION OF EXEMPLARY EMBODIMENTS

Hereinafter, the present invention will be described through embodiments of the invention, but the following embodiments do not limit the invention according to the claims. Further, not all the combinations of features described in the embodiments are essential for means to solve the problem in the invention.

Here, in the present specification, an expression such as "provided between . . . and . . . " do not limit a physical arrangement, and means "electrically connected to . . . and . . . ". In addition, in the present specification, meaning of an expression such as "connected" is not limited to being directly connected with no other device interposed, and includes being indirectly connected via another device.

Figure 1:
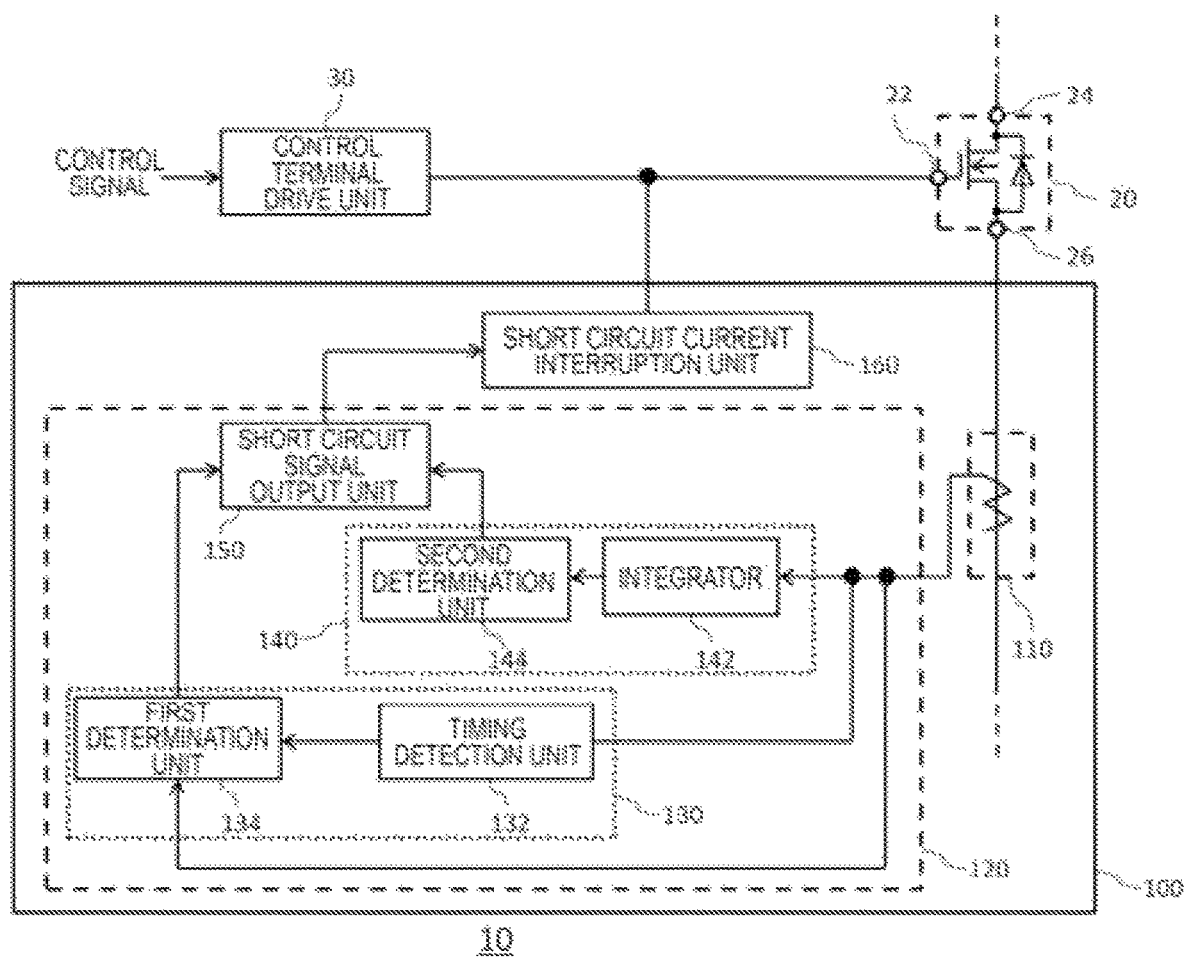
FIG. 1 shows an example of a block diagram of a switch apparatus 10 including a short circuit determination apparatus 100 according to the present embodiment.

FIG. 1 shows an example of a block diagram of a switch apparatus 10 including a short circuit determinsation apparatus 100 according to the present embodiment. In this diagram, each block shows a functional block that is functionally separated, and may not necessarily match an actual configuration. That is, in this diagram, even though each block is shown as a single block, each block may not be necessarily configured by a single circuit or device. In addition, in this diagram, even though the blocks are shown as separate blocks, the blocks may not be necessarily configured by separate circuits or devices.

The switch apparatus 10 includes a switching device 20, a control terminal drive unit 30, and a short circuit determination apparatus 100.

As an example, the switching device 20 may be a wide bandgap semiconductor device, and the wide bandgap semiconductor device may include, as a main material, at least any of silicon carbide, gallium nitride, gallium oxide, and diamond. Such a device with a high switching speed typically tends to have low short circuit tolerance. Accordingly, by setting such a high speed device as a target for a short circuit determination, the short circuit determination apparatus 100 can further enhance an effect of the present embodiment.

The switching device 20 has a control terminal 22, a first main terminal 24, and a second main terminal 26, and makes an electrical connection (On) or disconnection (Off) between the first main terminal 24 and the second main terminal 26 according to a voltage or a current which is input to the control terminal 22. As an example, in the present embodiment, the switching device 20 is an nMOS transistor that has a gate as the control terminal 22, a drain as the first main terminal 24, and a source as the second main terminal 26, and is turned off when a voltage of the control terminal 22 (also referred to as a "bias voltage") with the second main terminal 26 as a reference, that is, for example, a gate-source voltage Vgs is lower than or equal to a gate threshold voltage, and is turned on when the gate-source voltage Vgs exceeds the gate threshold voltage.

Hereinafter, the case where the switching device 20 is the nMOS transistor is described as an example; however, each embodiment can be applied to various types of switching devices 20 such as a MOS transistor in which a control terminal is referred to as a gate and two main terminals are referred to as a drain and a source, an IGBT (Insulated Gate Bipolar Transistor) in which a control terminal is referred to as a gate and two main terminals are referred to as a collector and an emitter, and a bipolar transistor in which a control terminal is referred to as a base, two main terminals are referred to as a collector and an emitter.

The control terminal drive unit 30 is connected to the control terminal 22 of the switching device 20, for example, the gate. Further, the control terminal drive unit 30 receives a power supply from a power source (not illustrated), and drives the control terminal 22 of the switching device 20 in response to a control signal which is input from an outside. Therefore, the control terminal drive unit 30 switches on and off between the first main terminal 24 and the second main terminal 26 of the switching device 20, for example, between the drain and the source.

The short circuit determination apparatus 100 detects a temporal change of a main current of the switching device 20, and determines a short circuit of the switching device 20 based on a detected result. At this time, the short circuit determination apparatus 100 according to the present embodiment determines that the switching device 20 is short-circuited, in a case where the temporal change of the main current is larger than or equal to a predetermined threshold value, after a first timing after the control signal is turned on.

The short circuit determination apparatus 100 includes a sensor 110, a short circuit determination unit 120, and a short circuit current interruption unit 160. Here, the short circuit determination apparatus 100 may be realized by one or more integrated circuits, or may be realized by a combination of a plurality of discrete components.

The sensor 110 detects the temporal change of the main current flowing between the first main terminal 24 and the second main terminal 26 in the switching device 20. As an example, the sensor 110 may be a Rogowski coil. Typically, in the Rogowski coil, by installing an air-core coil around a primary conductor, a voltage corresponding to a primary current flowing through the primary conductor is induced at both ends of the coil. At this time, the induced voltage has a temporal change of the primary current, that is, a differential waveform (di/dt). Such a Rogowski coil does not have a magnetic core, and is also free of heat generation, saturation, and hysteresis due to a magnetic loss, and thus is preferable. As an example in the present embodiment, the sensor 110 may be a Rogowski coil installed around a conductor connected to the second main terminal 26, for example, the source in the switching device 20. Further, the sensor 110 outputs, to the short circuit determination unit 120, for example, the voltage induced at both ends of the Rogowski coil, that is, the temporal change of the main current flowing between the first main terminal 24 and the second main terminal 26 in the switching device 20.

The short circuit determination unit 120 determines the short circuit of the switching device 20 based on the output of the sensor 110. The short circuit determination unit 120 includes a short circuit determination unit 130 during a steady operation, a short circuit determination unit 140 during a turn ON operation, and a short circuit signal output unit 150.

The short circuit determination unit 130 during a steady operation is a block that determines the short circuit of the switching device 20 that occurs during the steady operation. The short circuit determination unit 130 during a steady operation determines that the switching device 20 is short-circuited, in a case where the temporal change of the main current is larger than or equal to a first threshold value Th1, after the first timing after the control signal for driving the control terminal 22 is turned on. More specifically, the short circuit determination unit 130 during a steady operation includes a timing detection unit 132 and a first determination unit 134.

The timing detection unit 132 detects the first timing. In the present embodiment, the timing detection unit 132 may detect, as the first timing, a timing at which the temporal change of the main current is smaller than or equal to a second threshold value Th2. As an example, the timing detection unit 132 may be a comparator or the like, and may have one input terminal that is connected to an output of the sensor 110. Further, the timing detection unit 132 may compare the output of the sensor 110 input to the one input terminal, that is, the temporal change of the main current, with the second threshold value Th2 input to the other input terminal, and detect the first timing to output a detection signal to the first determination unit 134 when the temporal change of the main current is smaller than or equal to the second threshold value Th2.

The first determination unit 134 starts to determine whether the temporal change of the main current is larger than or equal to a first threshold value Th1, when the timing detection unit 132 detects the first timing. As an example, when the detection signal is supplied from the timing detection unit 132, the first determination unit 134 latches an edge of the detection signal, and starts to determine whether the output of the sensor 110, that is, the temporal change of the main current is larger than or equal to the first threshold value Th1. Further, when the temporal change of the main current is determined to be larger than or equal to the first threshold value Th1, the first determination unit 134 determines that the switching device 20 is short-circuited, and outputs a first short circuit sense signal to the short circuit signal output unit 150.

In this way, the first determination unit 134 starts the short circuit determination by using, as a trigger, the detection signal being supplied from the timing detection unit 132. In other words, the first determination unit 134 does not perform the short circuit determination until the detection signal is supplied from the timing detection unit 132. Accordingly, the first determination unit 134 does not output the first short circuit sense signal, for example, even in a case where the short circuit of the switching device 20 occurs during turn ON, and the output of the sensor 110, that is, the temporal change of the main current is larger than or equal to the first threshold value Th1. This will be described below by using a waveform.

The short circuit determination unit 140 during a turn ON operation is a block that determines the short circuit of the switching device 20 that occurs during the turn ON operation. The short circuit determination unit 140 during a turn ON operation determines that the switching device 20 is short-circuited when the main current is higher than or equal to a third threshold value Th3. More specifically, the short circuit determination unit 140 during a turn ON operation includes an integrator 142 and a second determination unit 144.

The integrator 142 is provided between the sensor 110 and the second determination unit 144, and integrates the output of the sensor 110. That is, the integrator 142 integrates the temporal change (di/dt) of the main current. Further, the integrator 142 outputs, to the second determination unit 144, a result of integrating the temporal change of the main current, that is, a value of the main current.

The second determination unit 144 determines the short circuit of the switching device 20 based on the output of the integrator 142. As an example, the second determination unit 144 determines whether the output of the integrator 142, that is, the value of the main current is higher than or equal to the third threshold value Th3. Further, when the output of the integrator 142 is determined to be higher than or equal to the third threshold value Th3, the second determination unit 144 determines that the switching device 20 is short-circuited, and outputs a second short circuit sense signal to the short circuit signal output unit 150.

Here, as described above, the first determination unit 134 starts the short circuit determination by using, as a trigger, the detection signal being supplied from the timing detection unit 132. In contrast, the second determination unit 144 is not provided with such a trigger, and always performs the short circuit determination. Accordingly, the second determination unit 144 determines that the switching device 20 is short-circuited and outputs the second short circuit sense signal in a case where the short circuit of the switching device 20 occurs during the turn ON, and the output of the integrator 142 is higher than or equal to the third threshold value Th3. This will also be described below by using a waveform.

The short circuit signal output unit 150 is connected to the first determination unit 134 and the second determination unit 144, and receives the first short circuit sense signal and the second short circuit sense signal. The short circuit signal output unit 150 may be, for example, a logical sum (OR) circuit. Further, when at least any one of the first short circuit sense signal and the second short circuit sense signal is input, the short circuit signal output unit 150 determines that the switching device 20 is short-circuited and outputs a short circuit signal to the short circuit current interruption unit 160.

As an example, the short circuit current interruption unit 160 is connected to the short circuit signal output unit 150 and the control terminal 22 of the switching device 20. Further, the short circuit current interruption unit 160 interrupts a short circuit current while suppressing a surge voltage, in a case where the short circuit signal is supplied from the short circuit signal output unit 150, that is, in a case where the switching device 20 is determined to be short-circuited at least either during the turn ON or during the steady operation. As an example, the short circuit current interruption unit 160 may include a transistor in which a control terminal is connected to the short circuit signal output unit 150, one end of a main terminal is connected to the control terminal 22 of the switching device 20, and the other end is connected to the second main terminal 26 of the switching device 20. Further, when the short circuit signal is supplied from the short circuit signal output unit 150, the short circuit current interruption unit 160 may turn on the transistor, and lower a control terminal voltage of the switching device 20, for example, the gate-source voltage Vgs to interrupt the short circuit current. At this time, the short circuit current interruption unit 160 may gently lower the control terminal voltage of the switching device 20 to reduce the surge voltage which is applied to the switching device 20 at a time of interrupting the short circuit current, thereby preventing a breakdown of the switching device 20. Note that in this diagram, the short circuit current interruption unit 160 is shown as a block separate from the control terminal drive unit 30; however, the short circuit current interruption unit 160 may be configured to be a part of the control terminal drive unit 30.

Figure 2:
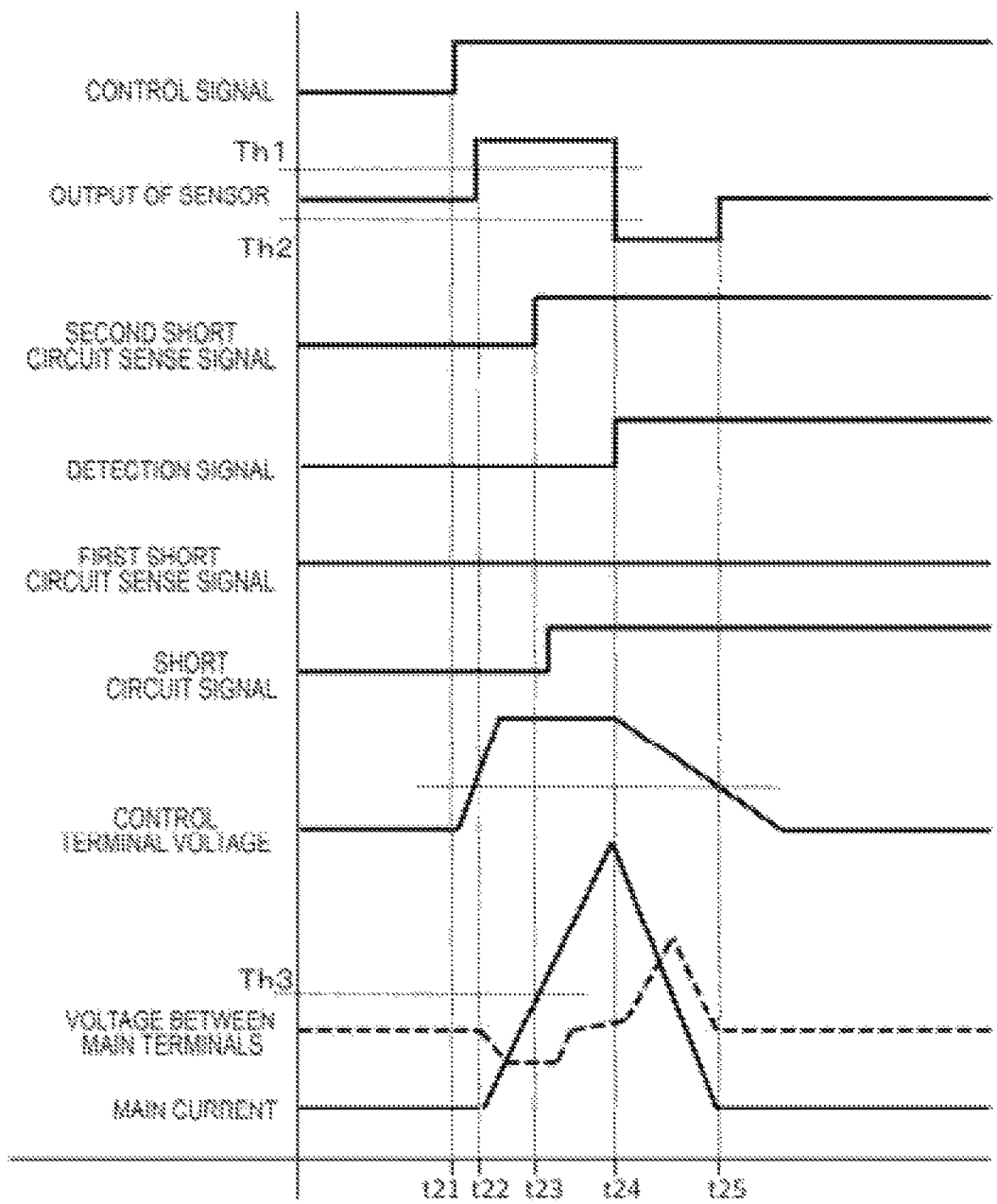

FIG. 2 shows an example of various signal waveforms in a case where a short circuit occurs during turn ON. When the control signal is turned on at time t21, the control terminal drive unit 30 drives the control terminal 22 of the switching device 20. In response to this, the control terminal voltage of the switching device 20, for example, the gate-source voltage Vgs begins to rise.

When the control terminal voltage exceeds the gate threshold voltage at time t22, the switching device 20 turns on. In response to this, the main current of the switching device 20 begins to increase. Accordingly, the output of the sensor 110 that detects the temporal change of the main current increases at time t22. This diagram shows an example of various signal waveforms when the switching device 20 is short-circuited, for some reason, at the same time as this turn ON.

Note that when the switching device 20 is turned on at time t22, the output of the sensor 110 is higher than or equal to the first threshold value Th1; however, at this point of time, the timing detection unit 132 does not yet output the detection signal, and thus the first determination unit 134 does not output the first short circuit sense signal.

Here, when the switching device 20 is not short-circuited, that is, in a normal turn ON operation, the current flowing through the switching device 20 is reduced by a reverse recovery operation of a flywheel diode (FWD) of a counter arm device (not illustrated), and thus the output of the sensor 110 takes a negative value. However, when the switching device 20 is short-circuited for some reason, the output of the sensor 110 remains to rise and the main current continues to increase.

At time t23, when the output of the integrator 142, which is obtained by integrating the output of the sensor 110, that is, the value of the main current is higher than or equal to the third threshold value Th3, the second determination unit 144 outputs the second short circuit sense signal to the short circuit signal output unit 150, assuming that the switching device 20 is short-circuited during the turn ON. In response to this, the short circuit signal output unit 150 outputs the short circuit signal to the short circuit current interruption unit 160.

At time t24, the short circuit current interruption unit 160 starts to interrupt the short circuit current after a delay in a transition from the output of the short circuit signal by the short circuit signal output unit 150 to the interruption operation. At this time, the short circuit current interruption unit 160 lowers the control terminal voltage of the switching device 20. In response to this, the main current begins to decrease. Note that at this time, the output of the sensor 110 is lower than or equal to the second threshold value Th2, and thus the timing detection unit 132 outputs the detection signal to the first determination unit 134.

At time t25, when the control terminal voltage is lower than or equal to the gate threshold voltage, the switching device 20 turns off. In response to this, the main current of the switching device 20 becomes 0. Accordingly, the output of the sensor 110 that detects the temporal change of the main current also becomes 0 at this timing.

In this way, when the switching device 20 is short-circuited during the turn ON, the short circuit determination apparatus 100 according to the present embodiment senses the short circuit of the switching device 20 and interrupts the short circuit current.

Figure 3:
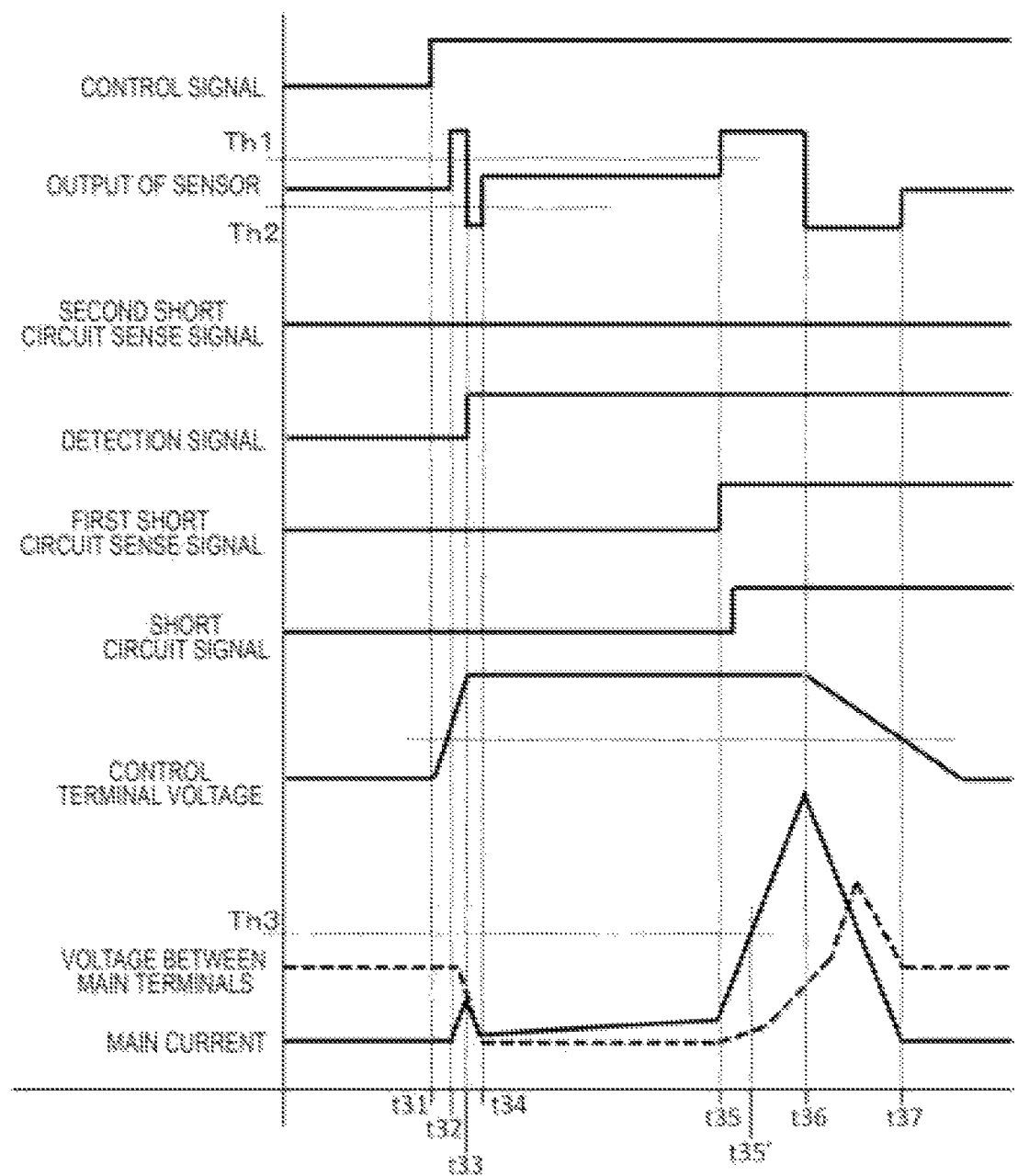
FIG. 3 shows an example of various signal waveforms in a case where a short circuit occurs during a steady operation.

FIG. 3 shows an example of various signal waveforms in a case where a short circuit occurs during a steady operation. When the control signal is turned on at time t31, the control terminal drive unit 30 drives, similarly to time 21, the control terminal 22 of the switching device 20. In response to this, the control terminal voltage of the switching device 20, for example, the gate-source voltage Vgs begins to rise.

When the control terminal voltage exceeds the gate threshold voltage at time t32, the switching device 20 turns on, similarly to time t22. In response to this, the main current of the switching device 20 begins to increase. Accordingly, the output of the sensor 110 that detects the temporal change of the main current increases at time t32. In FIG. 2, the case where the switching device 20 is short-circuited at the same time as this turn ON has been described, but in this diagram, the switching device 20 is assumed to be normally turned on without being short-circuited.

Note that when the switching device 20 is turned on at time t32, the output of the sensor 110 is higher than or equal to the first threshold value Th1; however, at this point of time, the timing detection unit 132 does not yet output the detection signal, and thus the first determination unit 134 does not output the first short circuit sense signal.

At time t33, the current flowing through the switching device 20 is reduced by a reverse recovery operation of a flywheel diode (FWD) of a counter arm device (not illustrated), and thus the output of the sensor 110 takes a negative value. In response to this, the output of the sensor 110 is lower than or equal to the second threshold value Th2, and thus the timing detection unit 132 outputs the detection signal to the first determination unit 134. That is, the timing detection unit 132 detects the time t33 as the first timing. Thereby, the first determination unit 134 starts the short circuit determination. Note that in this way, when the switching device 20 is normally turned on without being short-circuited, the output of the integrator 142, which is obtained by integrating the output of the sensor 110, that is, the value of the main current is not higher than or equal to the third threshold value Th3, until time t33.

At time t34, the switching device 20 starts the steady operation after a transition period accompanying the turn ON.

The switching device 20 is assumed to be short-circuited, for some reason, at time t35. Then, the main current increases sharply. In response to this, the output of the sensor 110 that detects the temporal change of the main current increases. Further, when the temporal change of the main current is larger than or equal to the first threshold value Th1, the first determination unit 134 determines that the switching device 20 is short-circuited during the steady operation, and outputs the first short circuit sense signal to the short circuit signal output unit 150. In response to this, the short circuit signal output unit 150 outputs the short circuit signal to the short circuit current interruption unit 160.

At time t36, the short circuit current interruption unit 160 starts to interrupt the short circuit current after the delay in a transition from the output of the short circuit signal by the short circuit signal output unit 150 to the interruption operation. At this time, the short circuit current interruption unit 160 lowers the control terminal voltage of the switching device 20. In response to this, the main current begins to decrease.

At time t37, when the control terminal voltage is lower than or equal to ON voltage, the switching device 20 turns off. In response to this, the main current of the switching device 20 becomes 0. Accordingly, the output of the sensor 110 that detects the temporal change of the main current also becomes 0 at this timing.

In this way, when the switching device 20 is short-circuited during the steady operation, the short circuit determination apparatus 100 according to the present embodiment senses the short circuit of the switching device 20 and interrupts the short circuit current. At this time, the short circuit determination apparatus 100 according to the present embodiment determines that the switching device 20 is short-circuited in the case where the temporal change of the main current is larger than or equal to the first threshold value Th1. This makes it possible to determine that the switching device 20 is short-circuited during the steady operation, at a comparatively early stage, with the short circuit determination apparatus 100 according to the present embodiment. That is, in a case the short circuit determination unit 140 during a turn ON operation is used to also perform the short circuit determination during the steady operation, the switching device 20 is determined to be short-circuited at time t35' when a value obtained by integrating the output of the sensor 110, that is, the main current is higher than or equal to the third threshold value Th3. In contrast, with the short circuit determination apparatus 100 according to the present embodiment, it is possible to determine that the switching device 20 is short-circuited at time t35 which is earlier than time t35'. In addition, in the short circuit determination apparatus 100 according to the present embodiment, the first determination unit 134 does not perform the short circuit determination before the first timing, and performs the short circuit determination after the first timing. With the short circuit determination apparatus according to the present embodiment, this makes it possible to prevent the first determination unit 134 from erroneously determining that the switching device 20 is short-circuited even when the turn ON is normally performed. Further, as described with reference to FIG. 2 and FIG. 3, in the short circuit determination apparatus 100 according to the present embodiment, the different determination units respectively determine the short circuit that occurs during the turn ON, and the short circuit that occurs during the steady operation. With the short circuit determination apparatus 100 according to the present embodiment, it is possible to sense a short circuit that occurs in any case, at a comparatively early timing.

Figure 4:
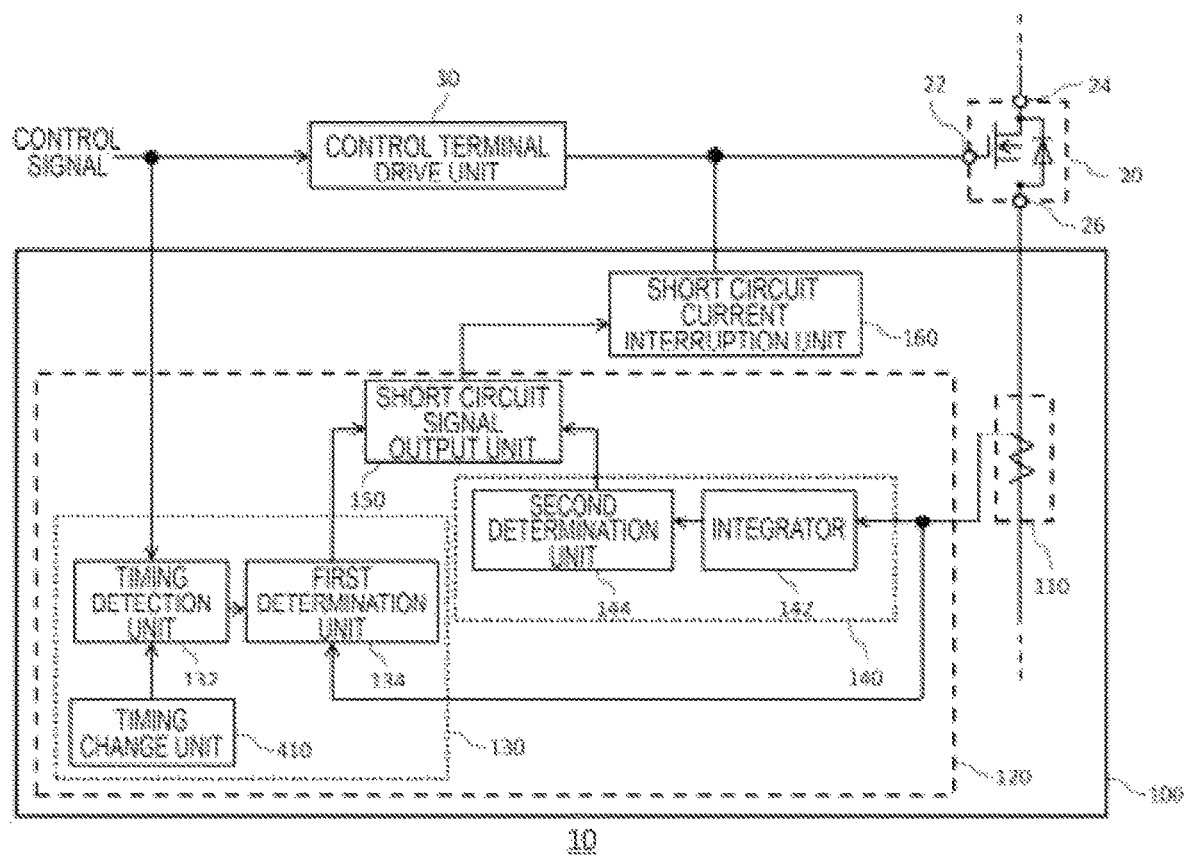
FIG. 4 shows an example of a block diagram of the switch apparatus 10 including the short circuit determination apparatus 100 according to a modification example of the present embodiment.

FIG. 4 shows an example of a block diagram of the switch apparatus 10 including the short circuit determination apparatus 100 according to a modification example of the present embodiment. In FIG. 4, the same signs and numerals are given to members having the same functions and configurations as those in FIG. 1, and the descriptions will be omitted except for the following differences. In the above description, the case where the timing detection unit 132 detects the first timing based on the output of the sensor 110, that is, the temporal change of the main current is shown as an example. However, the present invention is not limited to this.

In the present modification example, the timing detection unit 132 detects the first timing without using the output of the sensor 110. As an example, the timing detection unit 132 may acquire the control signal which is input to the control terminal drive unit 30. Further, the timing detection unit 132 detects, as the first timing, a timing at which a predetermined period expires after the control signal is turned on. More specifically, for example, a timer or the like may be used, and the timing detection unit 132 may start the timer at a timing when the control signal is turned on, and detect, as the first timing, the timing at which the predetermined period expires.

Here, the predetermined period may be, for example, set to be a period from when the control signal is turned on to when the reverse recovery of the flywheel diode is completed, in a case where the switching device 20 is normally turned on without being short-circuited. Such a period may be a predetermined period based on, for example, an experiment or a simulation.

In addition, in the present modification example, the short circuit determination unit 130 during a steady operation may further include a timing change unit 410.

The timing change unit 410 may be connected to the timing detection unit 132. As an example, the timing change unit 410 may change a length of the predetermined period based on at least any of magnitude of the main current, a temperature of the switching device 20, and characteristics of the switching device 20. Further, the timing change unit 410 may notify the timing detection unit 132 of information relating to the length of the changed period. Thereby, the timing detection unit 132 may detect the first timing based on the changed period. The period, from when the control signal is turned on to when the reverse recovery of the flywheel diode is completed, typically depends on a usage environment and the characteristics of the switching device 20. Accordingly, by the timing change unit 410 optimizing the period based on at least any of these, the short circuit determination apparatus 100 according to the present modification example can optimize the timing at which the first determination unit 134 starts the short circuit determination in accordance with the usage environment and the characteristics of the switching device 20.

Note that it is necessary to reset the output of the detection signal to the first determination unit 134 in preparation for the next turn ON when the switching device 20 normally turns off. The output of the detection signal may be automatically reset after being output for a certain period, or the output may be reset by using, as a trigger, the timing at which the output of the sensor 110 has a negative value due to turn Off of the switching device. In addition, in FIG. 4, the output of the detection signal to the first determination unit 134 may be reset by using the control signal which is input to the control terminal drive unit 30.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES 10 switch apparatus; 20 switching device; 22 control terminal; 24 first main terminal; 26 second main terminal; 30 control terminal drive unit; 100 short circuit determination apparatus; 110 sensor; 120 short circuit determination unit; 130 short circuit determination unit during a steady operation; 132 timing detection unit; 134 first determination unit; 140 short circuit determination unit during a turn ON operation; 142 integrator; 144 second determination unit; 150 short circuit signal output unit; 160 short circuit current interruption unit; 410 timing change unit

What is claimed is:
1. A short circuit determination apparatus comprising:
a sensor configured to detect, in a switching device that has a control terminal, a first main terminal, and a second main terminal, a temporal change of a main current flowing between the first main terminal and the second main terminal; and
a short circuit determination unit that has a first determination unit configured to determine that the switching device is short-circuited, in a case where the temporal change of the main current is larger than or equal to a first threshold value, only after a first timing after a control signal for driving the control terminal is turned on, wherein the short circuit determination unit has a timing detection unit configured to compare the temporal change of the main current with a second threshold value, and detect the first timing when the temporal change of the main current is smaller than or equal to the second threshold value.

2. The short circuit determination apparatus according to claim 1, wherein the first determination unit is configured to start to determine whether the temporal change of the main current is larger than or equal to the first threshold value, when the timing detection unit detects the first timing.

3. The short circuit determination apparatus according to claim 1, wherein the short circuit determination unit further includes an integrator configured to integrate the temporal change of the main current, and a second determination unit configured to determine a short circuit of the switching device based on an output of the integrator.

4. The short circuit determination apparatus according to claim 2, wherein the short circuit determination unit further includes an integrator configured to integrate the temporal change of the main current, and a second determination unit configured to determine a short circuit of the switching device based on an output of the integrator.

5. The short circuit determination apparatus according to claim 1, further comprising:

a short circuit current interruption unit configured to interrupt a short circuit current when the switching device is determined to be short-circuited.

6. The short circuit determination apparatus according to claim 2, further comprising:

a short circuit current interruption unit configured to interrupt a short circuit current when the switching device is determined to be short-circuited.

7. The short circuit determination apparatus according to claim 3, further comprising:

a short circuit current interruption unit configured to interrupt a short circuit current when the switching device is determined to be short-circuited.

8. The short circuit determination apparatus according to claim 1, wherein the sensor is a Rogowski coil.

9. The short circuit determination apparatus according to claim 2, wherein the sensor is a Rogowski coil.

10. The short circuit determination apparatus according to claim 3, wherein the sensor is a Rogowski coil.

11. The short circuit determination apparatus according to claim 5, wherein the sensor is a Rogowski coil.

12. The short circuit determination apparatus according to claim 1, wherein the switching device is a wide bandgap semiconductor device.

13. The short circuit determination apparatus according to claim 2, wherein the switching device is a wide bandgap semiconductor device.

14. The short circuit determination apparatus according to claim 3, wherein the switching device is a wide bandgap semiconductor device.

15. The short circuit determination apparatus according to claim 5, wherein the switching device is a wide bandgap semiconductor device.

16. The short circuit determination apparatus according to claim 8, wherein the switching device is a wide bandgap semiconductor device.

17. The short circuit determination apparatus according to claim 12, wherein the wide bandgap semiconductor device includes at least any of silicon carbide, gallium nitride, gallium oxide, and diamond.

18. A switch apparatus comprising:

the short circuit determination apparatus according to claim 1; and the switching device.

19. A switch apparatus comprising:

the short circuit determination apparatus according to claim 2; and the switching device.

20. A short circuit determination method for determining a short circuit of a switching device that has a control terminal, a first main terminal, and a second main terminal, the method comprising:

detecting a temporal change of a main current flowing between the first main terminal and the second main terminal;

comparing the temporal change of the main current with a second threshold value, and detecting a first timing when the temporal change of the main current is smaller than or equal to the second threshold value; and determining that the switching device is short-circuited, in a case where the temporal change of the main current is larger than or equal to a first threshold value, only after the first timing after a control signal for driving the control terminal is turned on.

* * * * *